United States Patent
Gardner et al.

(10) Patent No.: US 11,842,919 B2
(45) Date of Patent: Dec. 12, 2023

(54) METHOD OF MAKING 3D ISOLATION

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 271 days.

(21) Appl. No.: 17/094,947

(22) Filed: Nov. 11, 2020

(65) Prior Publication Data

US 2021/0391207 A1    Dec. 16, 2021

Related U.S. Application Data

(60) Provisional application No. 63/037,796, filed on Jun. 11, 2020.

(51) Int. Cl.

| | |
|---|---|
| H01L 29/775 | (2006.01) |
| H01L 21/762 | (2006.01) |
| H01L 29/78 | (2006.01) |
| H01L 29/66 | (2006.01) |
| H01L 21/8238 | (2006.01) |
| H01L 27/092 | (2006.01) |

(52) U.S. Cl.
CPC .... *H01L 21/762* (2013.01); *H01L 21/823807* (2013.01); *H01L 21/823821* (2013.01); *H01L 21/823878* (2013.01); *H01L 27/0924* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | |
|---|---|---|
| 9,627,494 B2 | 4/2017 | Masuoka et al. |
| 9,978,768 B2 | 5/2018 | Xu et al. |
| 10,410,925 B2 | 9/2019 | Sills et al. |
| 10,741,456 B2 | 8/2020 | Cheng et al. |
| 10,833,078 B2 | 11/2020 | Smith et al. |
| 2016/0204251 A1 | 7/2016 | Masuoka et al. |

(Continued)

OTHER PUBLICATIONS

International Search Report and Written Opinion dated Aug. 25, 2021 in PCT/US2021/030939, 10 pages.

*Primary Examiner* — Joseph C. Nicely
*Assistant Examiner* — Lamont B Koo
(74) *Attorney, Agent, or Firm* — Oblon, McClelland, Maier & Neustadt, L.L.P.

(57) ABSTRACT

A method of microfabrication is provided. An initial stack of layers is formed over a semiconductor layer. The initial stack of layers can include a plurality of substacks separated from each other by one or more transition layers. One or more of the substacks include a sacrificial gate layer sandwiched between two first dielectric layers. Openings can be formed in the initial stack of layers so that the semiconductor layer is uncovered. The openings can be filled with vertical channel structures, where each vertical channel structure extends through a respective substack. The initial stack can be divided into separate stacks that include the vertical channel structures surrounded by the substacks and the transition layers. The one or more transition layers can be removed from the separate stacks to uncover transition points between neighboring vertical channel structures. Isolation structures can be formed at the transition points.

11 Claims, 13 Drawing Sheets

(56) References Cited

U.S. PATENT DOCUMENTS

| | | |
|---|---|---|
| 2018/0006041 A1 | 1/2018 | Xu et al. |
| 2019/0172828 A1 | 6/2019 | Smith et al. |
| 2019/0206736 A1 | 7/2019 | Sills et al. |
| 2019/0259663 A1 | 8/2019 | Sills et al. |
| 2020/0118891 A1 | 4/2020 | Cheng et al. |
| 2020/0118892 A1 | 4/2020 | Cheng et al. |
| 2021/0028169 A1 | 1/2021 | Smith et al. |

METHOD OF MAKING 3D ISOLATION

INCORPORATION BY REFERENCE

This present disclosure claims the benefit of U.S. Provisional Application No. 63/037,796, filed on Jun. 11, 2020, the entire content of which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and methods of forming the semiconductor device.

A first aspect is a method of fabrication. The method includes forming an initial stack of layers over a semiconductor layer. The initial stack of layers can include a plurality of substacks separated from each other by one or more transition layers. One or more of the substacks include a sacrificial gate layer sandwiched between two first dielectric layers. Openings can be formed in the initial stack of layers so that the semiconductor layer is uncovered. The openings can be filled with vertical channel structures, where each vertical channel structure extends through a respective substack. The initial stack can be divided into separate stacks that include the vertical channel structures surrounded by the substacks and the transition layers. The transition layers can be removed from the separate stacks to uncover transition points between neighboring vertical channel structures, and isolation structures can be formed at the transition points.

In some embodiments, prior to removing the transition layers from the separate stacks, support structures can be formed that are connected to the separate stacks. The support structures leave portions of the separate stacks uncovered. In some embodiments, after forming isolation structures at the transition points, the support structures are removed.

In some embodiments, the vertical channel structures are separated from each other in a vertical direction by sacrificial interface structures disposed at the transition layers, and the transition points between the neighboring vertical channel structures include respective sacrificial interface structures. In some embodiments, after removing the transition layers, the sacrificial interface structures are removed so that gaps are formed between the neighboring vertical channel structures.

In some embodiments, forming the isolation structures includes depositing an electrical insulator at the transition points. In some embodiments, forming the isolation structures includes converting portions of the vertical channel structures at the transition layers to oxide.

In some embodiments, the method may further include removing the sacrificial gate layers from the separate stacks so that the vertical channel structures are uncovered. Gate layers can be formed over the uncovered vertical channel structures. In some embodiments, each vertical channel structure includes a vertical channel sandwiched between a source region and a drain region. In some embodiments, each substack in the separate stacks includes a vertical gate-all-around (GAA) transistor, and the vertical GAA transistors are separated from each other by the isolation structures. In some embodiments, the gate layers can include a high-k dielectric around the vertical channel structures and a work function metal around the high-k dielectric.

In some embodiments, an insulating material is deposited to fill spaces between the separate stacks. In some embodiments, after dividing the initial stack into the separate stacks, a second dielectric layer is deposited over uncovered portions of the semiconductor layer.

A second aspect is a semiconductor device. The semiconductor device can include a semiconductor layer and at least two layers of transistors over the semiconductor layer. Each layer of transistors includes a plurality of transistors that are separated from each other along a horizontal plane and aligned with respective transistors of other layers in a vertical direction. The semiconductor device can also include isolation structures sandwiched between neighboring transistors in the vertical direction.

In some embodiments, one or more of the transistors can include a vertical channel structure, a source region and a drain region on two opposing ends of the vertical channel structure, and a gate stack around the vertical channel structure. In some embodiments, the gate stack includes a high-k dielectric around the vertical channel structure and a work function metal around the high-k dielectric. In some embodiments, the vertical channel structures are aligned with respective vertical channel structures in the vertical direction.

In some embodiments, the vertical channel structures within a particular layer of transistors include a same channel material, and the vertical channel structures of a particular layer of transistors include a different channel material from the vertical channel structures of a neighboring layer of transistors. In some embodiments, the layers of transistors can alternate between a PMOS layer and an NMOS layer.

In some embodiments, the isolation structures include at least one of silicon oxide, germanium oxide, or another electrical insulator.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 4 is a cross-sectional view taken along the line cut 4A4A', in accordance with exemplary embodiments of the disclosure.

FIGS. 2, 3, 4, 9, 10, 11, 12, 13, 14 and 15 are cross-sectional or top-down views of a semiconductor device at various intermediate steps of a second manufacturing process, in accordance with exemplary embodiments of the disclosure.

FIGS. 2, 3, 4, 9, 10, 11A, 12, 13, 16, 17, and 18 are cross-sectional views of a semiconductor device at various intermediate steps of a third manufacturing process, in accordance with exemplary embodiments of the disclosure.

FIGS. 2, 19, 20, 21, 22, and 23 are cross-sectional or top-down views of a semiconductor device at various intermediate steps of a fourth manufacturing process, in accordance with exemplary embodiments of the disclosure.

DETAILED DESCRIPTION

Figure 1A:
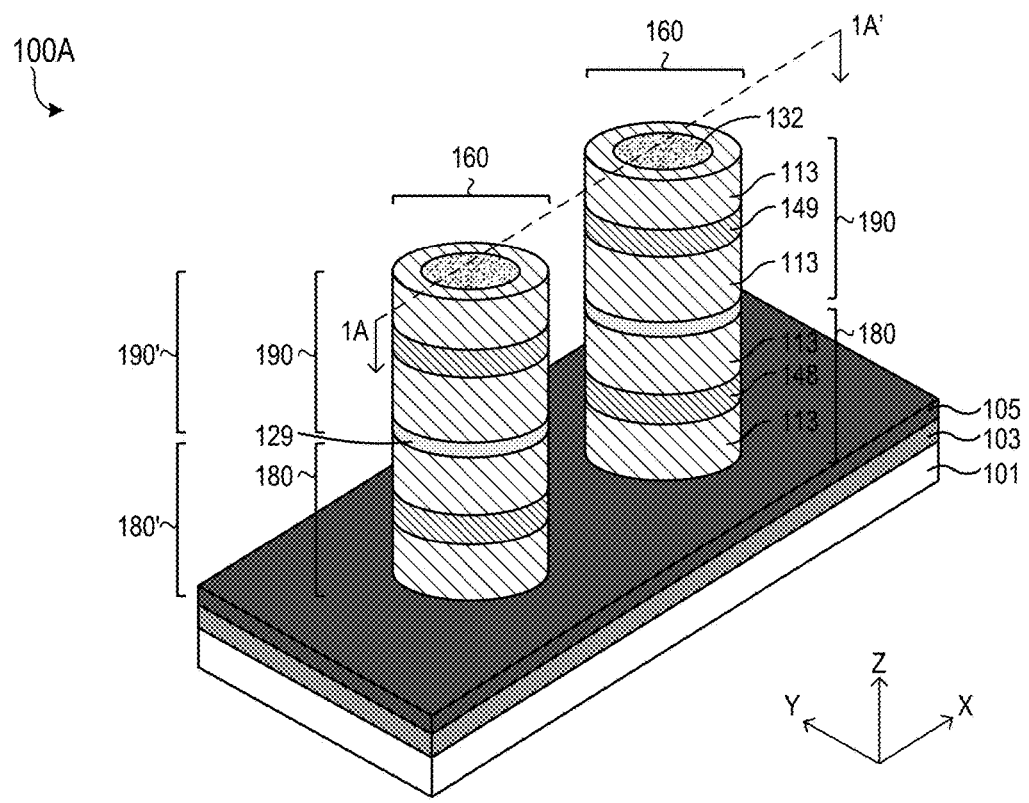
FIG. 1A shows a perspective view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein provide methods to isolate semiconductor devices, including isolating structures vertically in any sequence starting from any substrate condition to form vertical CMOS GAA (gate-all-around) transistors. An example involving two transistors is NMOS-lower/PMOS-upper, NMOS-upper/PMOS-lower, NMOS/NMOS, and PMOS/PMOS. 3D isolation may optionally be executed on a stack including a plurality of transistors, for example two to ten transistors or more, because 3D isolation is executed on all transistors simultaneously.

Methods herein can be applied to vertically grown channels. Because the epitaxial material/structure is grown vertically, such structures are self-aligned to a precise dielectric stack. This self-alignment enables 3D isolation to be precisely placed at desired locations to isolate each vertical GAA transistor. In some embodiments, all isolation of all 3D transistors in a stack or region or chip can be achieved with just one process sequence consisting of a few process steps. A plurality of vertical GAA transistors, for example two to ten transistors or more, can be processed with simultaneous 3D isolation herein. Multiple stacks of PMOS, NMOS, or any device elements may be stacked with isolation and achieved with increased circuit density. 360 degree access is provided to transistors with 3D isolation for improved circuit layout.

FIG. 1A shows a perspective view of a semiconductor device 100A, in accordance with some embodiments. The semiconductor device 100A includes a substrate 101 and a semiconductor layer 105 over the substrate 101. The semiconductor layer 105 can be made of Si, Ge, SiGe, or another semiconductor material with n-type or p-type doping, depending on design requirements. In this example, the semiconductor device 100A can also include an insulating material 103 sandwiched between the semiconductor layer 105 and the substrate 101.

The semiconductor device 100A further includes at least two layers of transistors (e.g., a first layer of transistors 180' and a second layer of transistors 190') over the semiconductor layer 105. Each layer of transistors (e.g., 180') includes a plurality of transistors (e.g., first transistors 180) that are separated from each other along an XY plane and aligned with respective transistors (e.g., second transistors 190) of other layers (e.g., 190') in a vertical direction. Hence, the semiconductor device 100A can have a plurality of separate stacks 160. While two first transistors 180 and two second transistors 190 are shown in this example, it is understood that each layer of transistors can typically include more than two transistors in other embodiments. As a result, the semiconductor device 100A can typically include more than two separate stacks 160. While the separate stacks 160 and the transistors (e.g., 180 and 190) are shown to be cylindrical, the separate stacks 160 and the transistors (e.g., 180 and 190) can also have other shapes. The transistors (e.g., 180 and 190) will be explained in greater detail in FIG. 1B.

Further, the semiconductor device 100A includes isolation structures 129 that are sandwiched between neighboring transistors in the Z direction (e.g., the first transistors 180 and the second transistors 190). The isolation structures 129 can function as an electrical insulator and can, for example, be made of silicon oxide and/or germanium oxide. The isolation structures 129 can be formed by thermal oxidization, chemical vapor deposition, atomic layer deposition, and/or the like.

Figure 1B:
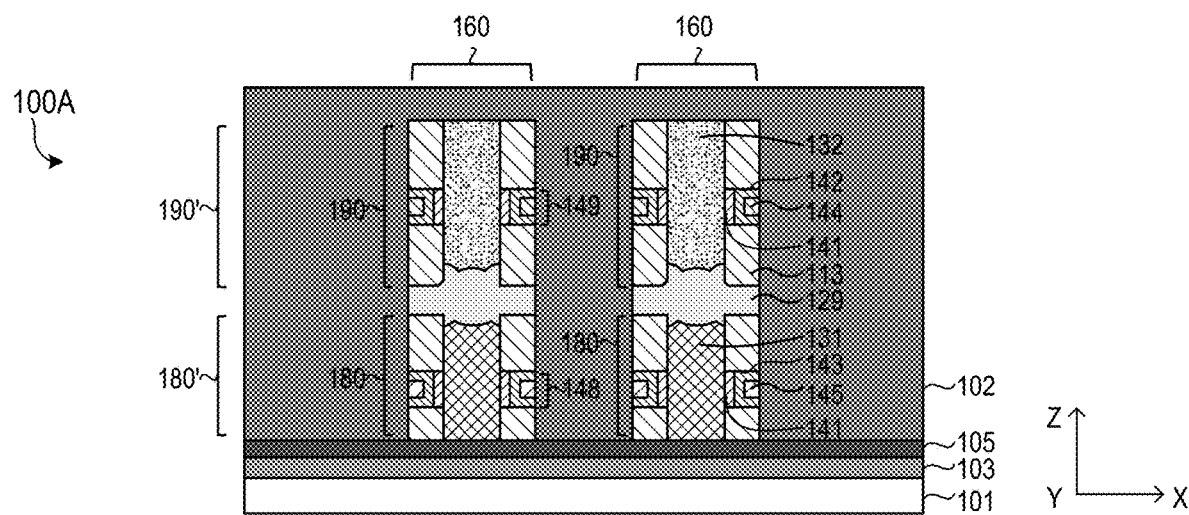
FIG. 1B shows a cross-sectional view taken along the line cut 1A1A' in FIG. 1A, in accordance with some embodiments.

FIG. 1B shows a cross-sectional view taken along the line cut 1A1A' in FIG. 1A, in accordance with some embodiments. As shown, each of the first transistors 180 can include a first vertical channel structure 131 extending in a Z direction and a first gate stack 148 all around the first vertical channel structure 131. The first gate stack 148 are sandwiched between first dielectrics 113 that are also disposed all around the first vertical channel structure 131. Therefore, the first vertical channel structure 131 is a GAA channel structure. While not shown, the first vertical channel structure 131 can include a source region and a drain region on two opposing ends of the first vertical channel structure 131 in the Z direction. The first dielectrics 113 can isolate the first gate stack 148 from the source region and the drain region. The first gate stack 148 can include a high-k dielectric 141 surrounding the first vertical channel structure 131 and first work function metals (WFMs) 143 and 145 surrounding the high-k dielectric 141. In some embodiments, geometric shapes of the first WFMs 143 and 145 may be different. In some embodiments, the first gate stack 148 may include only one first WFM surrounding the high-k dielectric 141.

As illustrated, the second transistors 190 are similar to the first transistors 180, except that each of the second transistors 190 includes a second vertical channel structure 132 and a second gate stack 149 that includes second WFMs 142 and 144. In this example, the first transistors 180 are NMOS devices, and the second transistors 190 are PMOS devices. Accordingly, the semiconductor layer 105 is n-type. In another example, the first transistors 180 and the second transistors 190 can be NMOS and PMOS devices, respectively. The semiconductor layer 105 is p-type. In other embodiments where the semiconductor device 100A includes more than two layers of transistors, the layers of transistors can alternate between a PMOS layer and an NMOS layer.

In addition, the semiconductor device 100A further includes an insulating material 102 over the semiconductor layer 105. The insulating material 102 fills spaces between the separate stacks 160.

Figure 1C:
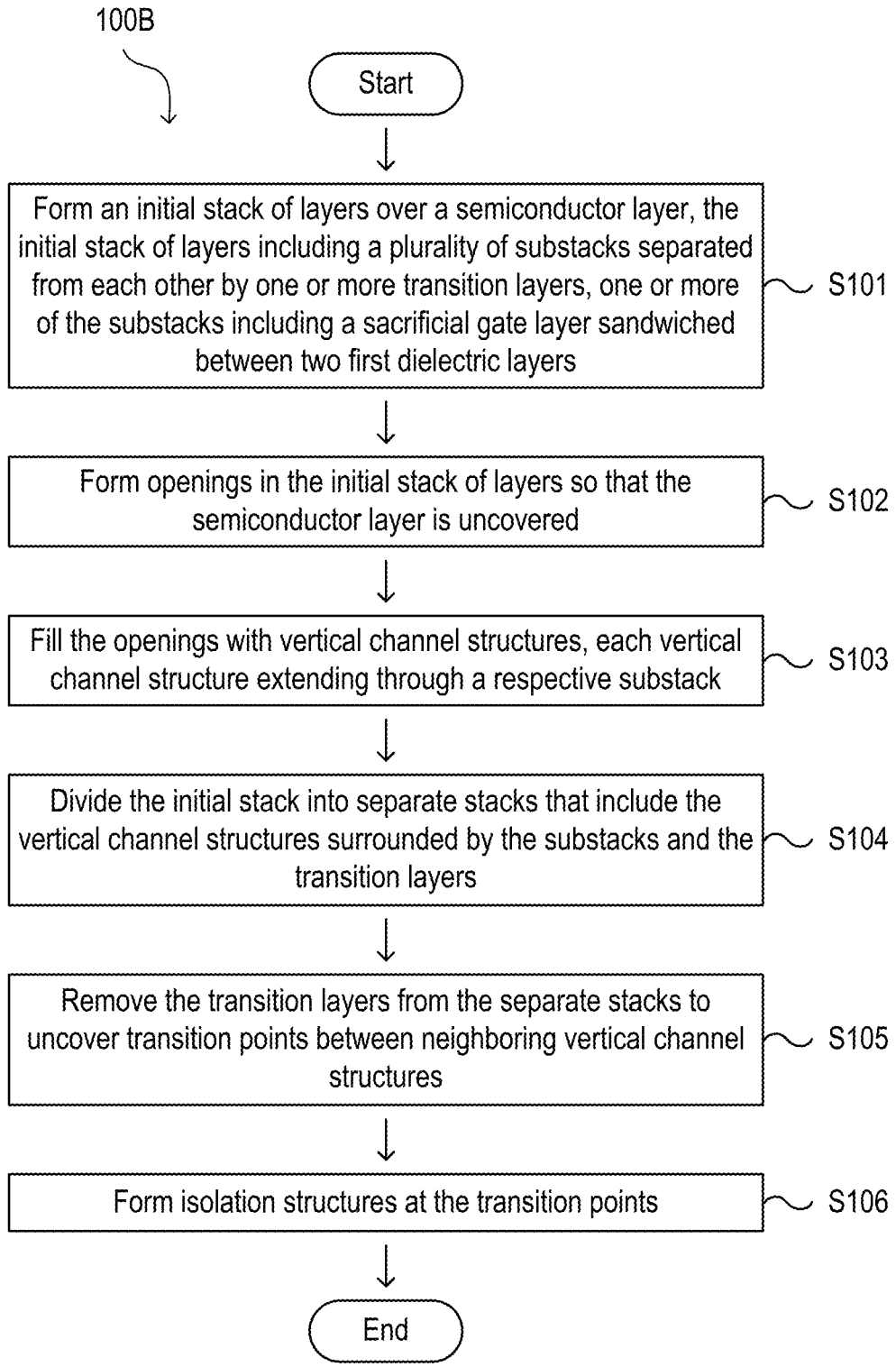
FIG. 1C shows a flow chart of an exemplary process for manufacturing an exemplary semiconductor device, in accordance with embodiments of the disclosure.

FIG. 1C shows a flow chart of an exemplary process 100B for manufacturing an exemplary semiconductor device, such as the semiconductor device 100A and the like, in accordance with embodiments of the disclosure. The process 100B begins with step S101 where an initial stack of layers is formed over a semiconductor layer. The initial stack of layers can include a plurality of substacks that are separated from each other by transition layers. One or more of the substacks can include a sacrificial gate layer sandwiched between two first dielectric layers. The substacks will be used to form future transistors.

At step S102, openings are formed in the initial stack of layers so that the semiconductor layer is uncovered. At step S103, the openings can be filled with vertical channel structures. Each vertical channel structure extends through a respective substack. In some embodiments, the vertical channel structures are separated from each other in a vertical direction by sacrificial interface structures disposed at the transition layers.

At step S104, the initial stack is divided into separate stacks that include the vertical channel structures surrounded by the substacks and the transition layers. In some embodiments, support structures are formed. The support structures can be connected to respective separate stacks and leave portions of the separate stacks uncovered. The support structures can prevent the separate stacks from collapsing during future manufacturing.

At step S105, the transition layers are removed from the separate stacks to uncover transition points between neighboring vertical channel structures. In some embodiments, the transition points between the neighboring vertical channel structures include respective sacrificial interface structures.

At step S106, isolation structures are formed at the transition points. In some embodiments, the isolation structures can be formed by depositing an electrical insulator at the transition points. In some embodiments, the isolation structures can be formed by converting portions of the vertical channel structures at the transition layers to oxide. In some embodiments, a combination of insulator deposition and converting portions of the vertical channel structures may be used.

It should be noted that additional steps can be provided before, during, and after the process 100B, and some of the steps described can be replaced, eliminated, or performed in a different order for additional embodiments of the process 100B. For example, after step S106, the sacrificial gate layers can be replaced with gate layers. The gate layers can be deposited all around the vertical channel structures to form GAA channel structures. As a result, transistors can be formed in the substacks and be separated from each other by the isolation structures. In some embodiments, an insulating material can be deposited to fill spaces between the separate stacks. In some embodiments, the support structures may be left in the final stack.

Several examples of embodiments will be described to form 3D isolation herein. FIGS. 2-8 are cross-sectional views of a semiconductor device 200 at various intermediate steps of a first manufacturing process, in accordance with exemplary embodiments of the disclosure. Particularly, FIGS. 2-8 can illustrate 3D isolation of two or more vertical CMOS GAA transistors that have a grown epitaxial doping of N+ or P+ silicon or germanium (an example will show two devices separated by a self-aligned grown dielectric isolation layer). A plurality of vertical devices, for example two to ten, may be selected for isolation.

Figure 2:
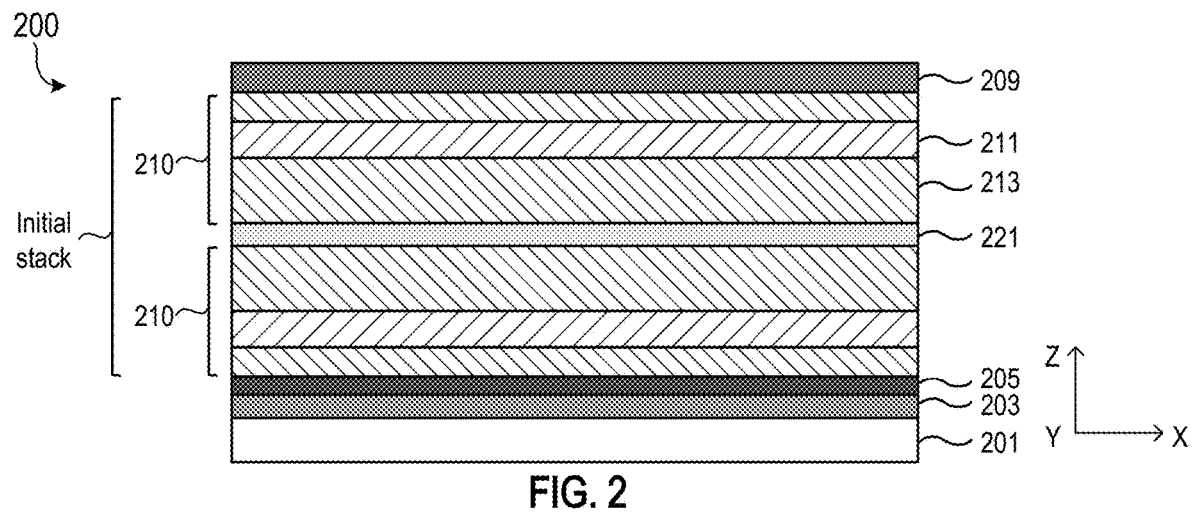
FIGS. 2, 3, 4, 5, 6, 7, and 8 are cross-sectional views of a semiconductor device at various intermediate steps of a first manufacturing process, in accordance with exemplary embodiments of the disclosure.

Referring to FIG. 2, the first manufacturing process flow can begin by creating a stack of layers. The semiconductor device 200 shows a substrate 201 with a layer of an insulating material 203 formed thereon. Then a semiconductor layer 205 of Si, Ge, SiGe, or another semiconductor material with n-type or p-type doping is formed. Then over the semiconductor layer 205, an initial stack of layers is formed. The initial stack of layers can include a plurality of substacks 210 that are separated from each other by a transition layer 221, and each substack 210 can include a sacrificial gate layer 211 that is sandwiched between two first dielectric layers 213. Note that in other embodiments, the semiconductor device 200 can typically include more than two substacks 210 that are separated by transition layers 221. In addition, a hard mask 209 is formed over the initial stack in this example.

The transition layer 221 will be used as a future isolation region to isolate devices that are stacked vertically, and the substacks 210 will be used to form the vertically stacked devices. The future isolation region is disposed between two future transistor regions. The sacrificial gate layers 211 will be future gate electrode regions for the two GAA vertically grown devices of this example. This example embodiment uses N+ epitaxial material grown for the source, drain, and channel for NMOS, and P+ epitaxial material grown for the source, drain, channel for PMOS as an example. Any channel or S/D regions, however, are possible. Techniques herein generally provide a method of marking 3D isolations between isolation post channel formation.

The sacrificial gate layers 211, the first dielectric layers 213, and the transition layer 221 are made of different materials that are chosen to all be selective to one another. That is, there are one or more etchants and/or etching conditions such that a given one material of the three (211, 213, and 221) can be etched without etching (or substantially etching) the other two materials. An example dielectric scheme can include oxide based SiOx, SiOxNy based, high-k based, and High-k OxNy based. With high-k materials, changing an element used with high-k or with oxide can cause selectivity also within the different types of high-k. Either wet etch or dry etch can be used. To further enhance selectivity options, combinations of all wet etch, all dry etch, or wet and dry etch can also provide more options for a three-material selectivity scheme.

Figure 3:
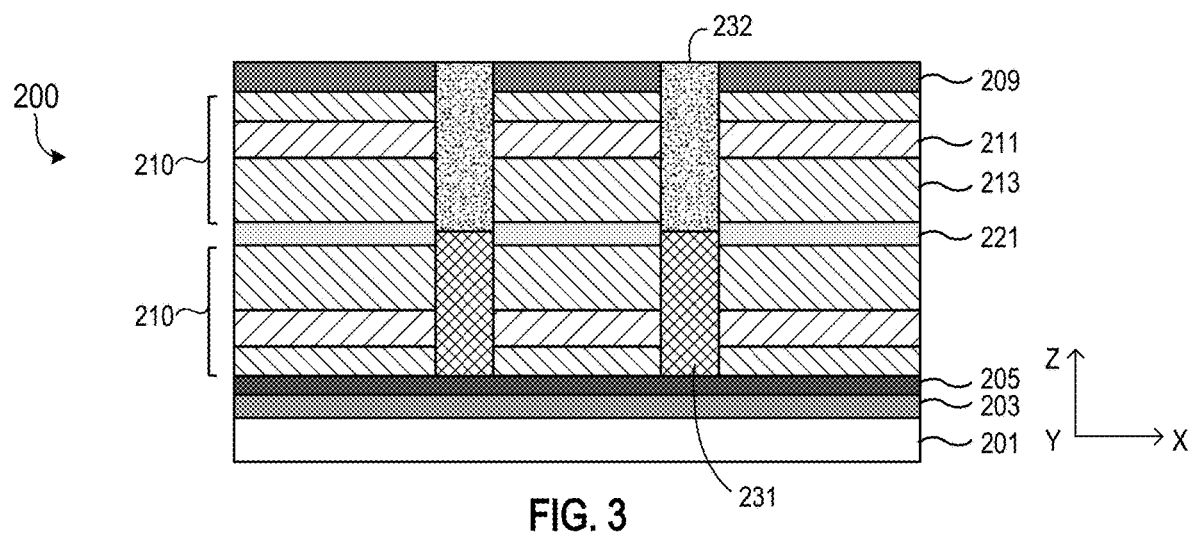

In FIG. 3, vertical channel structures (e.g., first vertical channel structures 231 and second vertical channel structures 232) are formed that extend through the initial stack. The first vertical channel structures 231 and the second vertical channel structures 232 are also referred to as the first channels 231 and the second channels 232, respectively. Each vertical channel structure can extend through a respective substack 210. To form the vertical channel structures, a plurality of openings (not shown) is formed in the initial stack of layers so that the semiconductor layer 205 is uncovered, and then the openings are filled with the vertical channel structures.

Specifically, a first etch mask (not shown) is formed over the layer stack. This can be a photoresist mask. An etching process is then executed using this first mask to create the openings down to the semiconductor layer 205. Note that the openings formed in the stack can be rectangular, cylindrical, or other shapes. Subsequently, the first etch mask is removed, followed by epitaxial growth to partially fill the openings with the first channels 231. The first channels 231 are grown until reaching the future isolation region. After the first channels 231 are grown partially into the transition layer 221, the second channels 232 are then grown from tops of the first channels 231 at the future isolation region (in situ epitaxial growth) until reaching a top of the substrate stack. In this example, the semiconductor layer 205, the first channels 231, and the second channels 232 are N+, N+, and P+ epitaxial materials, respectively. Note the substrate 201 or the semiconductor layer 205 can be different and the order of epitaxial growth can be reversed (P over N, or N over P). Also any type of un-doped or doped element for any epitaxial element is possible with techniques herein depending on circuit and device requirements.

Figure 4:
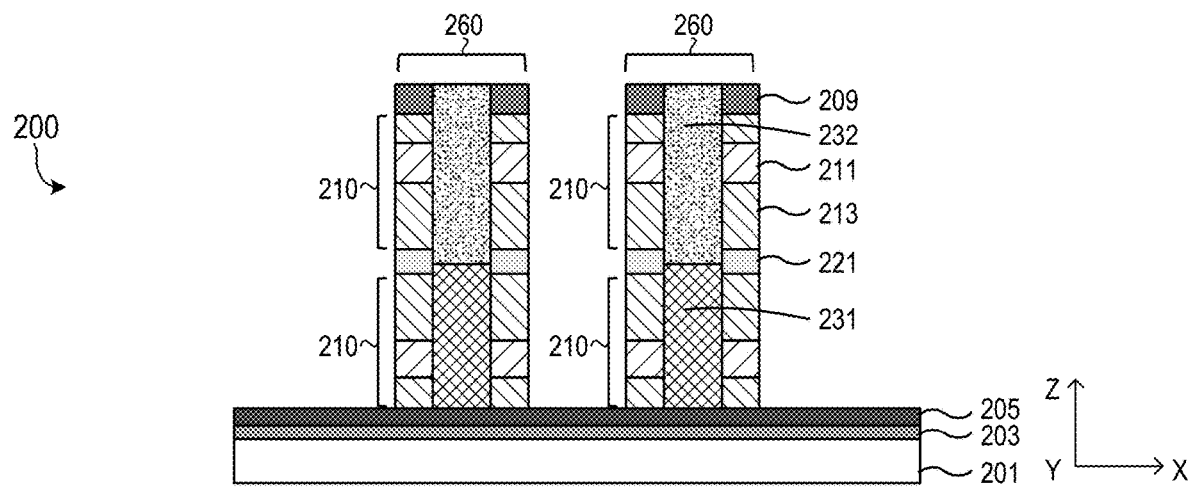

In FIG. 4, the initial stack is divided into separate stacks 260 that include the vertical channel structures (e.g., 231 and 232) surrounded by the substacks 210 and the transition layers 221. In order to form the separate stacks, a second etch mask (not shown) is formed that covers the columns of the epitaxial materials (i.e., the vertical channel structures), and extends a predetermined thickness beyond a perimeter of the vertical channel structures. Then, a directional etch is executed using this second mask until uncovering the semiconductor layer 205. At this point, future isolation (e.g., 221) and gate electrode regions (e.g., 211) are uncovered. The second etch mask is then removed.

Figure 4A:
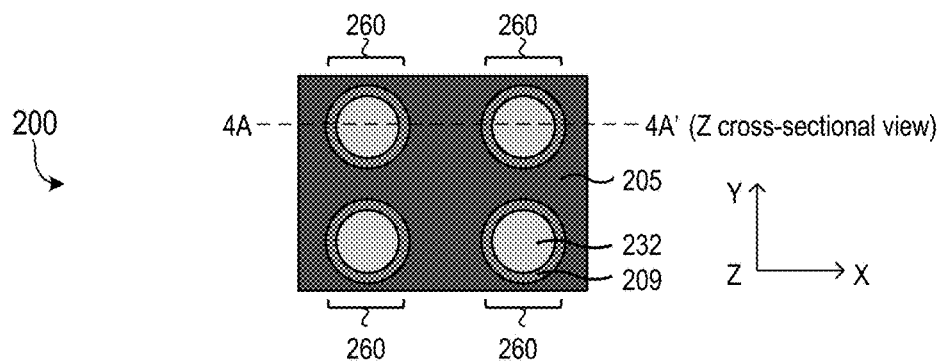
FIG. 4A is a top-down view of the semiconductor device in FIG. 4 where

FIG. 4A is a top-down view of the semiconductor device 200 in FIG. 4 where FIG. 4 is a cross-sectional view taken along the line cut 4A4A', in accordance with exemplary embodiments of the disclosure. While the semiconductor device 200 is shown to have four separate stacks 260 in a 2×2 array, it is understood that the semiconductor device 200 can typically include more than four separate stacks 260 in any kind of array.

Figure 5:
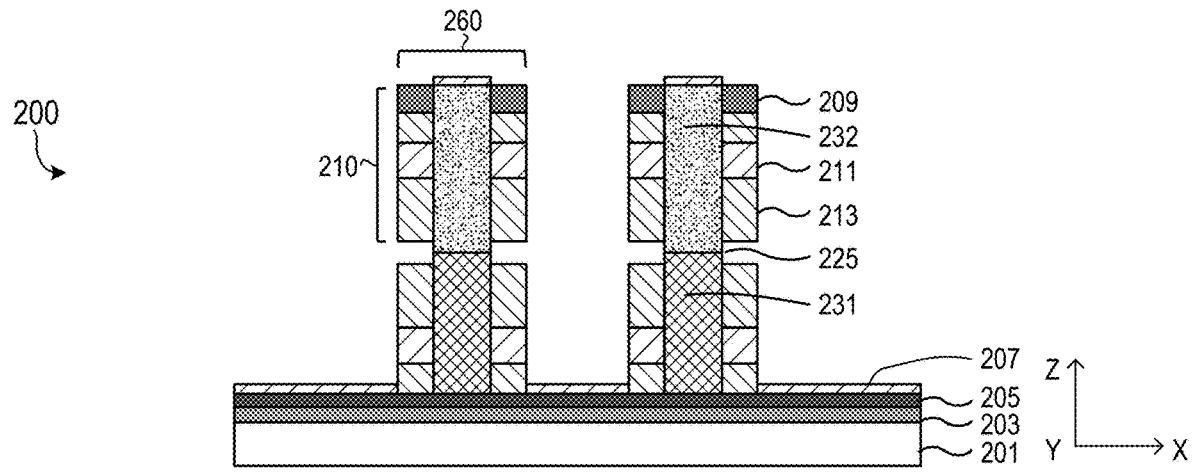

In FIG. 5, a second dielectric layer 207 is grown or selectively deposited on the uncovered semiconductor layer 205. The second dielectric layer 207 may also be deposited on the second channels 232. The transition layer 221 is removed (isotropically), which uncovers transition points 225 between neighboring vertical channel structures (e.g., 232 and 231). The future isolation region (e.g., the interface between vertical NMOS channel and vertical PMOS channel in this example) will be formed at the transition points 225.

Figure 6:
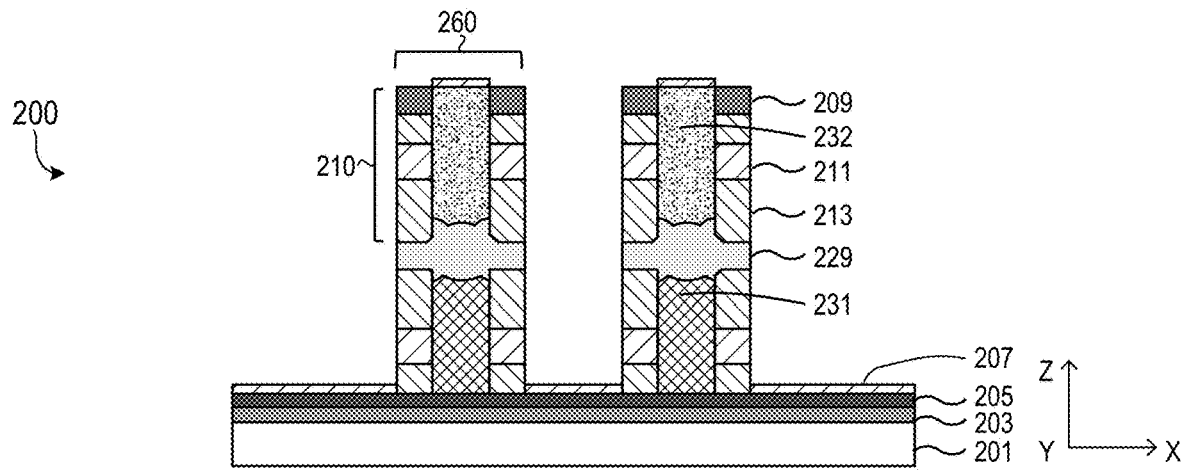

In FIG. 6, isolation structures 229 are formed at the transition points 225. The isolation structures 229 can be made of silicon oxide, germanium oxide, and/or another electrical insulator. For example, oxidation of the uncovered channel regions can be executed, that is, oxide can be formed at the interface of the first channels 231 and the second channels 232. Particularly, a portion of each channel material (N+ and P+ epitaxial materials) can be converted to silicon oxide, germanium oxide, or another electrical insulator. At this point, electrical isolation has been achieved between two future vertical GAA transistors.

Figure 7:
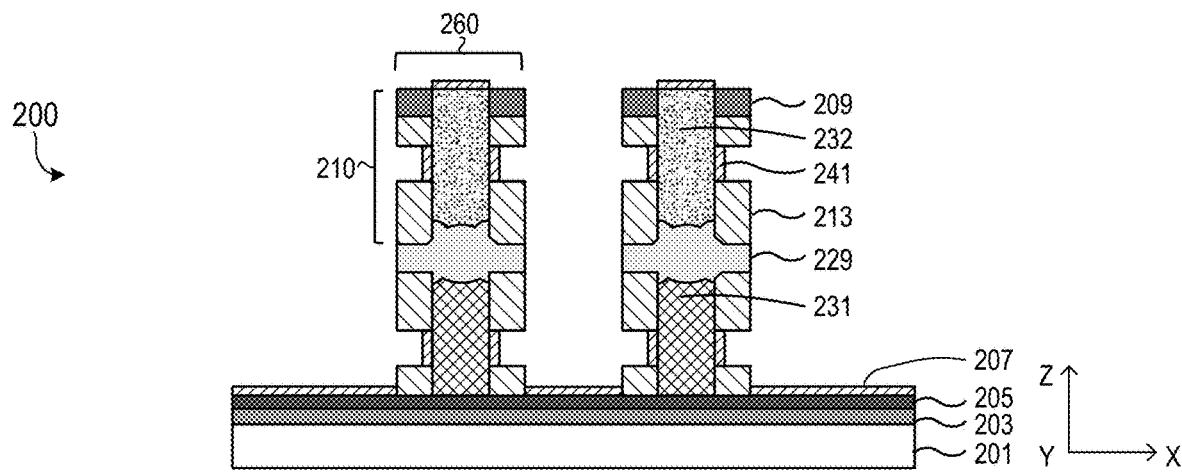

In FIG. 7, the sacrificial gate layers 211 are selectively removed, followed by selective high-k deposition. That is, a high-k dielectric 241 is deposited all around a cross section of each vertical channel. In some embodiments, the high-k dielectric 241 may also be deposited over the underlying semiconductor layer 205 and/or top surfaces of the vertical channel stack.

Figure 8:
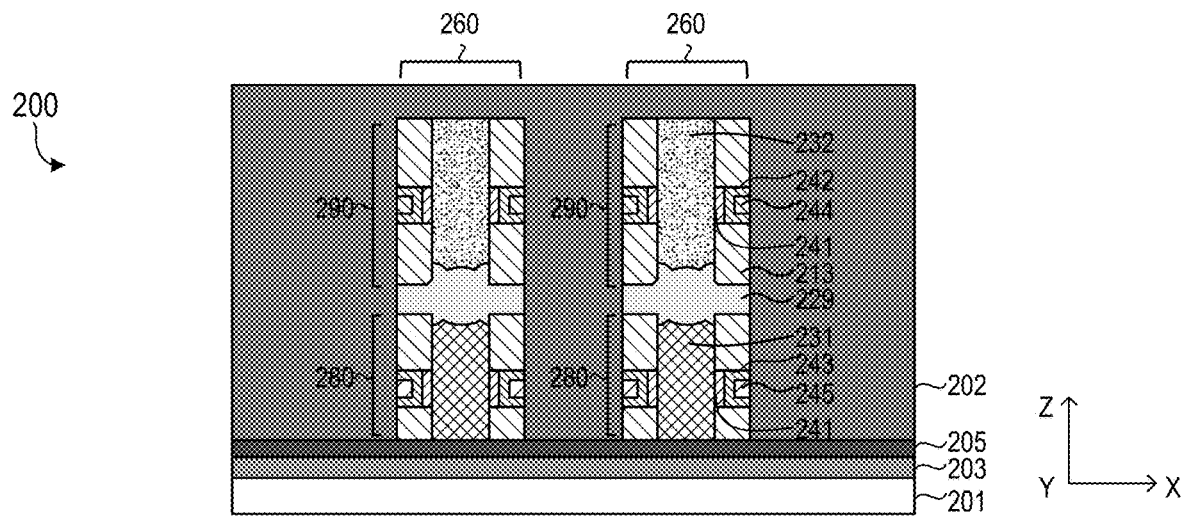

In FIG. 8, gate electrodes with WFMs are completed for NMOS and PMOS, followed by dielectric deposition to fill spaces around the stacks of vertical-channel GAA transistors for electrical hookup connections. That is, first WFMs (e.g., 243 and 245) and second WFMs (e.g., 242 and 244) are formed around the high-k dielectric 241. As a result, first transistors 280 and second transistors 290 are formed in the separate stacks 260. Then, a third dielectric 202 is deposited to fill the spaces. In this example, the first transistors 280 and second transistors 290 are NMOS and PMOS devices, respectively. Alternatively, the first transistors 280 and second transistors 290 can be PMOS and NMOS devices, respectively. In other embodiments where the separate stacks 260 have more than two transistors stacked in the Z direction, the more than two transistors can alternate between NMOS and PMOS and be separated from each other by the isolation structures 229. In addition, while not shown, source and drain regions can be formed on ends of the vertical channel structures (e.g., 231 and 232), and the second dielectric layer 207 can remain over the semiconductor layer 205.

FIGS. 2-4 and 9-15 are cross-sectional or top-down views of the semiconductor device 200 at various intermediate steps of a second manufacturing process, in accordance with exemplary embodiments of the disclosure. Particularly, FIGS. 2-4 and 9-15 illustrate a 3D isolation flow of two or more vertical epi CMOS GAA transistors that begin similarly as the first manufacturing process, but add an additional 3D support structure that holds a portion of the pillar in place while the isolation sequence is completed. This method allows small pillar dimensions with diameter of 3 nm and below to use the 3D isolation techniques herein for a plurality of vertical devices. For example, this method can allow more vertical layers than the first manufacturing process demonstrated in FIGS. 2-8. Moreover, this example isolation flow includes an optional flow for making a different sequence for metal gate electrodes.

Figure 9:
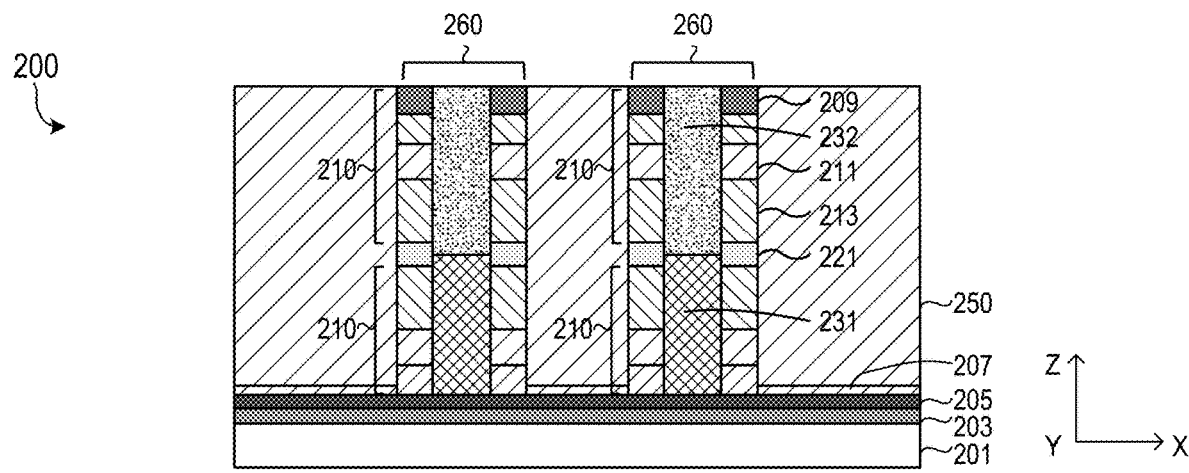

The second manufacturing process begins with steps illustrated in FIGS. 2-4 and then proceeds to FIG. 9. In FIG. 9, a sacrificial material 250 is deposited over the substrate 201 and is planarized, thus filling spaces around the separate stacks 260 of vertical-flow channels. Example materials for the sacrificial material 250 include polycrystalline silicon, germanium by atomic layer deposition, or dielectrics by chemical vapor deposition, or any other material compatible with selectivity of stack materials. Chemical mechanical planarization (CMP) can be used to planarize the sacrificial material 250.

Figure 10:
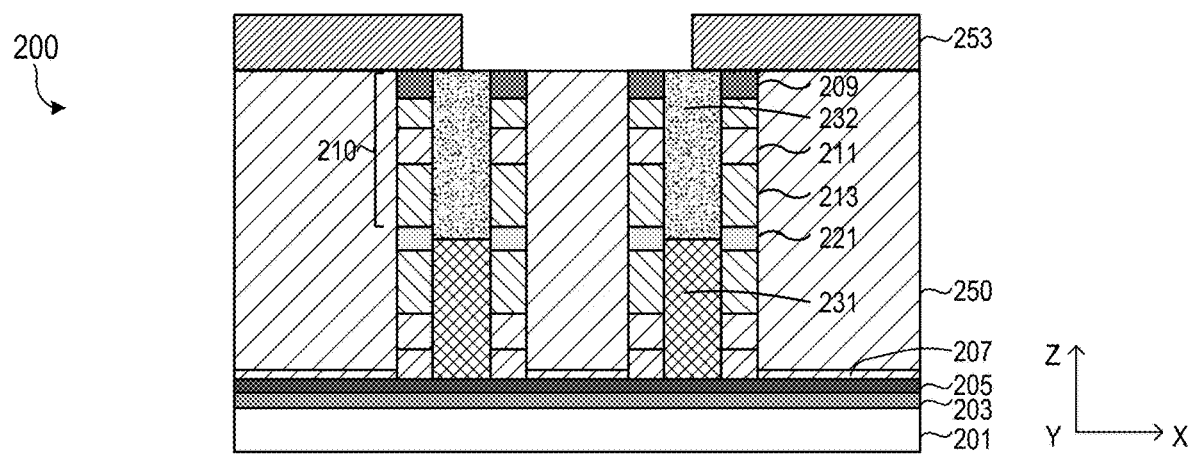

In FIG. 10, a third etch mask 253 is formed to cover a portion of the vertical channel structures (e.g., 232) and a portion of the sacrificial material 250 that can be used to form future support structures.

Figure 11A:
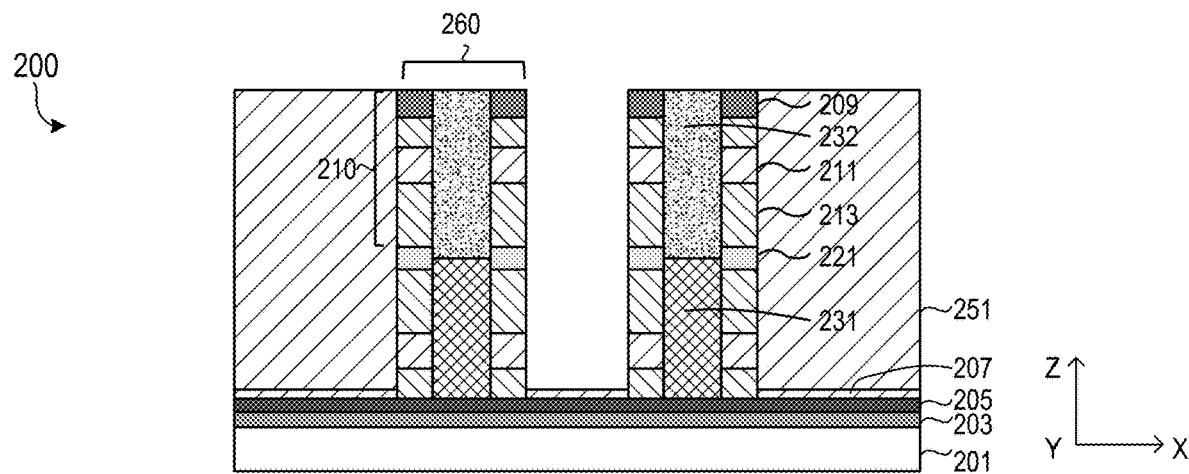
FIGS. 11A, 11B, and 11C are cross-sectional views taken along the line cuts 11A11A', 11B11B', and 11C11C' in FIG. 11, respectively, in accordance with exemplary embodiments of the disclosure.

FIG. 11A is a top-down view of the semiconductor device 200 after executing a directional etch to remove an uncovered portion of the sacrificial material 250 and then removing the third etch mask 253. As a result, the remaining sacrificial material 250 can form support structures 251 that are connected to the separate stacks 260. The support structures 251 leave portions of the separate stacks 260 uncovered for future etching and deposition and can be used to prevent the separate stacks 260 from collapsing during future etching.

Figure 11:
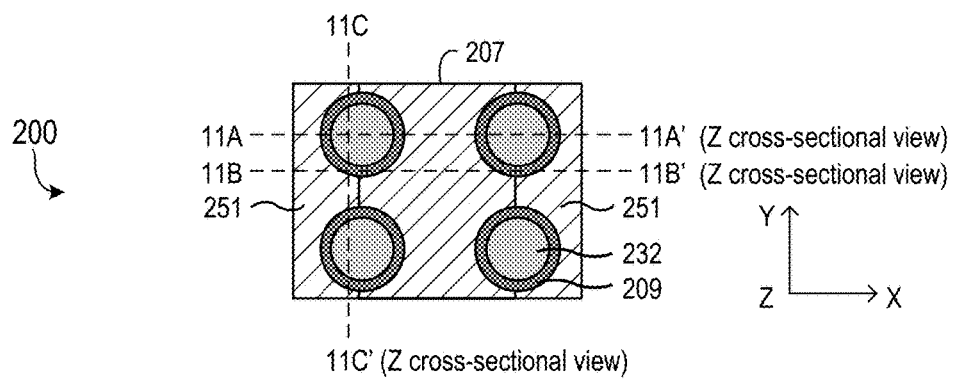
Figure 11B:
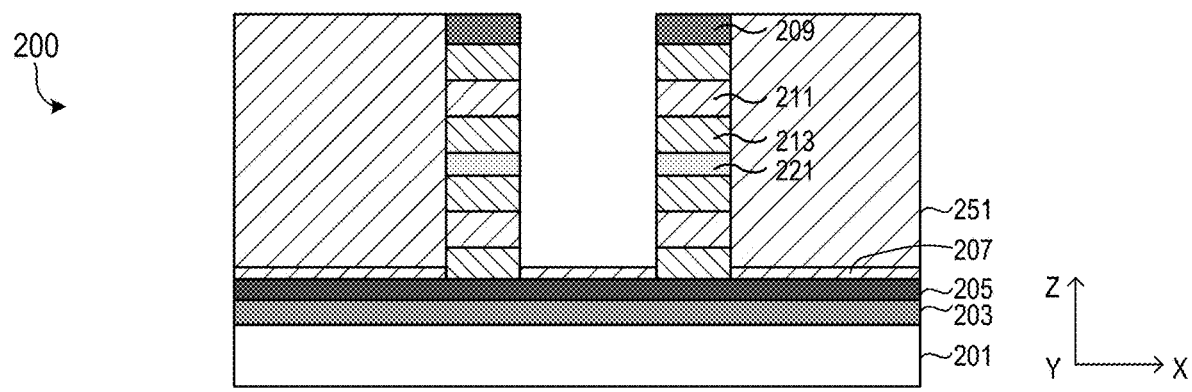
Figure 11C:
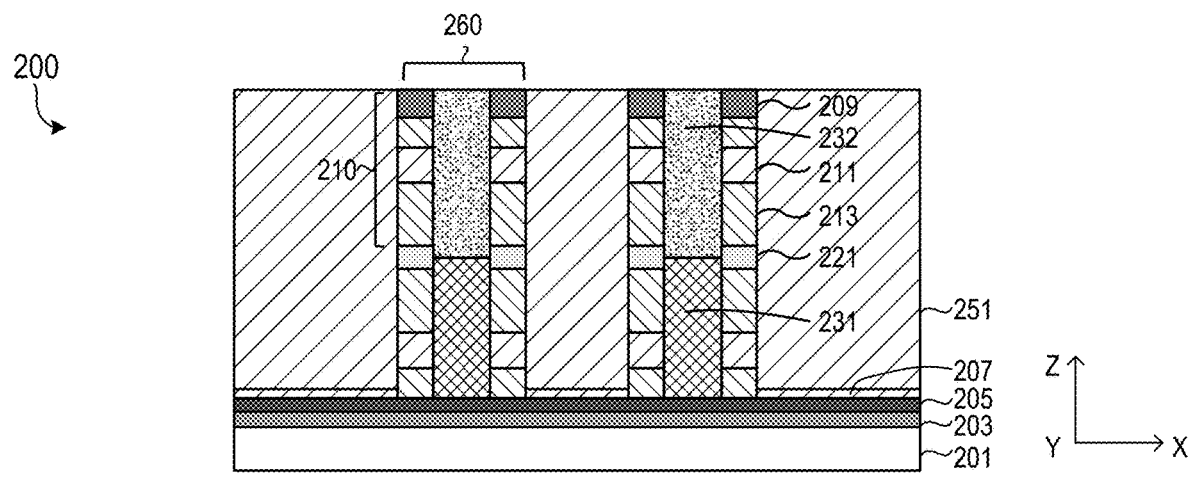

FIG. 11 is a top-down view of the semiconductor device 200 in FIG. 11 where FIG. 11 is a cross-sectional view taken along the line cut 11A11A', in accordance with exemplary embodiments of the disclosure. FIGS. 11B and 11C are cross-sectional views taken along the line cuts 11B11B' and 11C11C' in FIG. 11, respectively. As shown, a portion of the second dielectric layer 207 is exposed. The support structures 251 are connected to the separate stacks 260 while portions of the separate stacks 260 remain uncovered.

Figure 12:
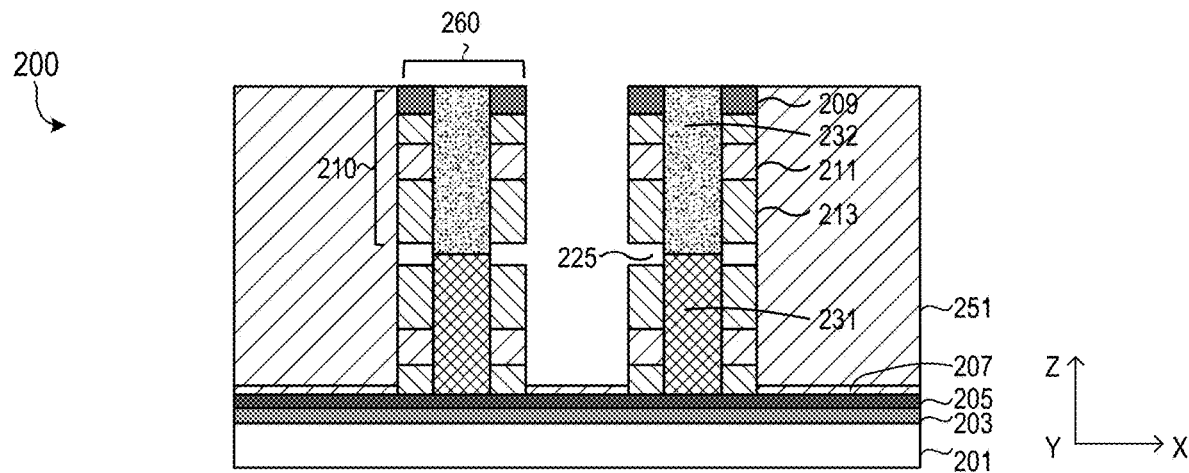

The second manufacturing process then proceeds to FIG. 12 where the transition layers 221 are removed from the separate stacks 260, which uncovers the transition points 225 at the interface of the two (or each) vertical-flow channels. As illustrated, the support structures 251 can provide mechanical support to the separate stacks 260 at this step.

Figure 13:
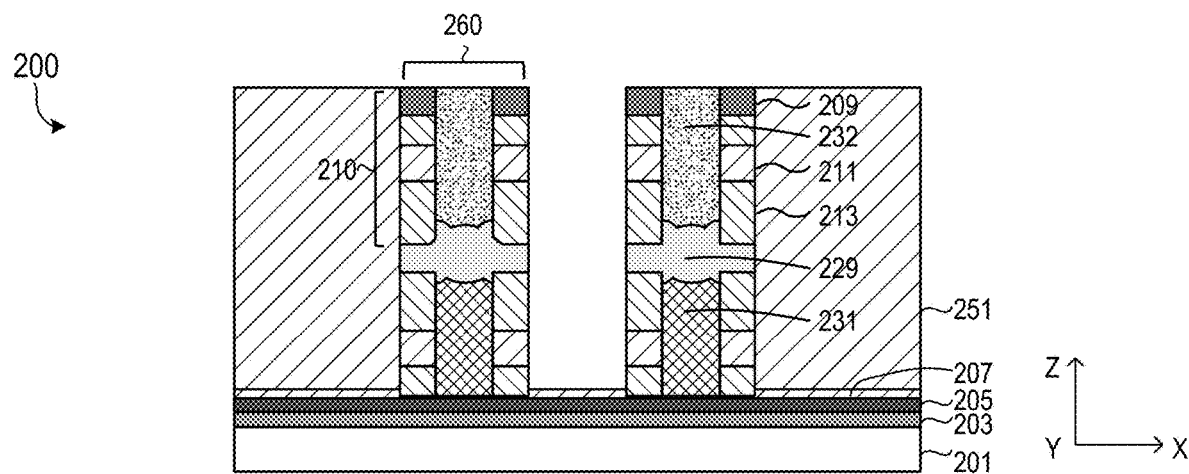

In FIG. 13, the isolation structures 229 are formed, similar to FIG. 6. As shown, FIG. 13 can show oxidation of interface channel regions at the transition points 225 to convert portions of the vertical channel structures to oxide. For example, a portion of a silicon channel can be converted to form vertical 3D silicon oxide isolation. Now the first channels 231 and the second channels 232 are isolated between two future vertical transistors.

Figure 14:
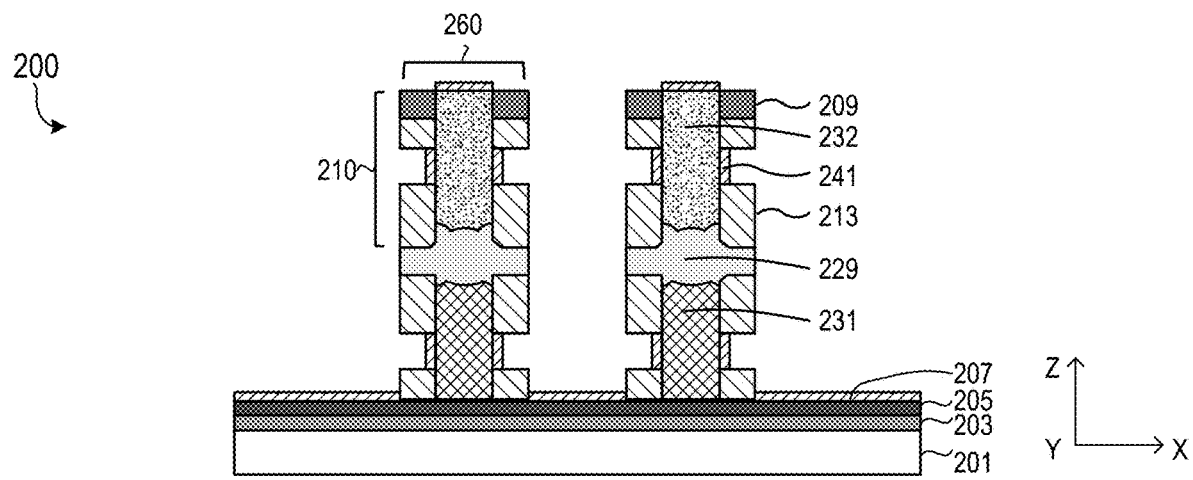

In FIG. 14, the support structures 251 and the sacrificial gate layers 211 are removed, which uncovers portions of the first and second channels 231 and 232. Then, the high-k dielectric 241 is deposited all around the uncovered portions of the first and second channels 231 and 232.

Figure 15:
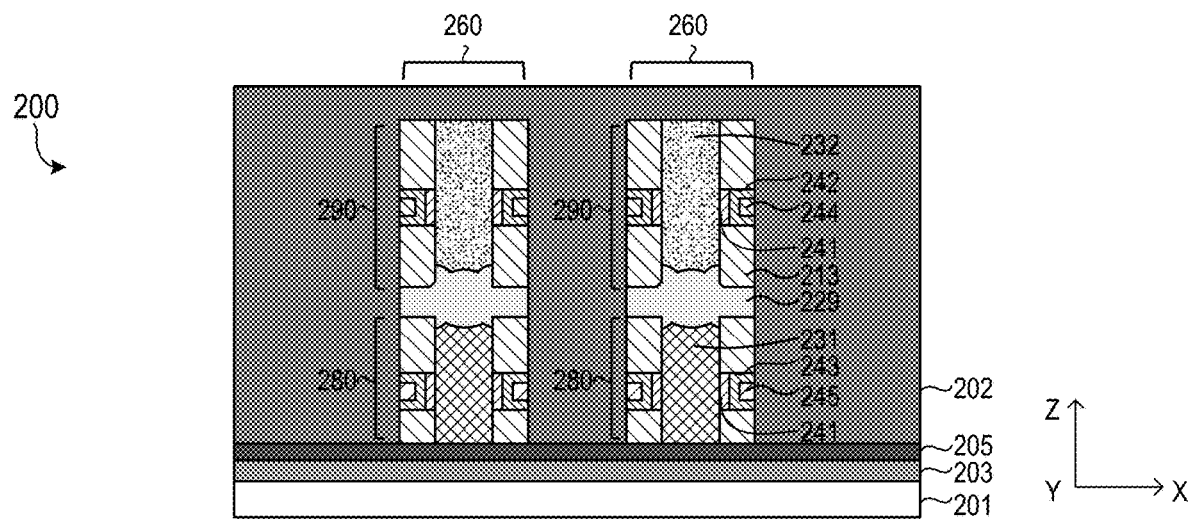

FIG. 15 illustrates the semiconductor device 200 after completion of WFM and dielectric deposition ready for electrical hookups and corresponds to FIG. 8. The descriptions have been provided above and will be omitted for simplicity purposes. Note that in some embodiments, the support structures 251 can be optionally left in the finished stack.

Figure 16:
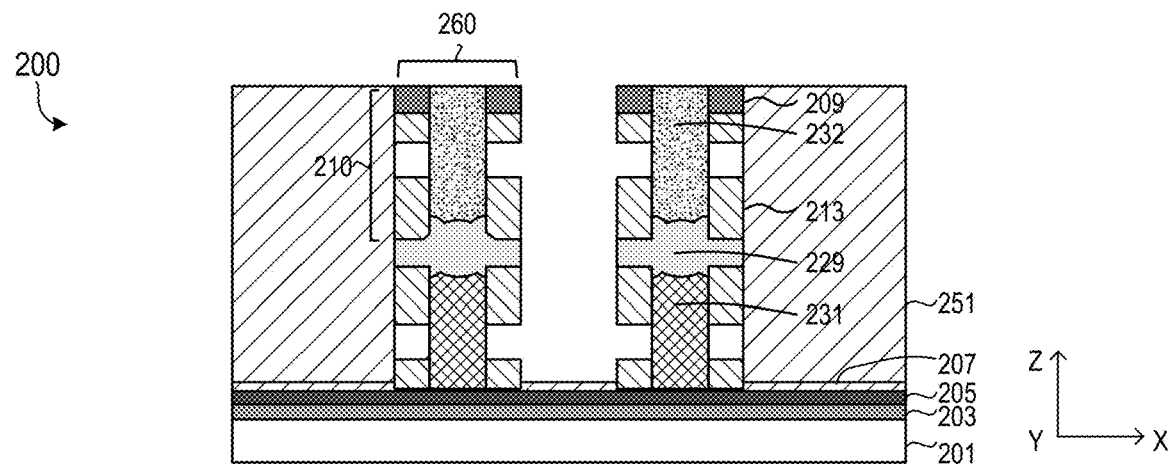
Figure 17:
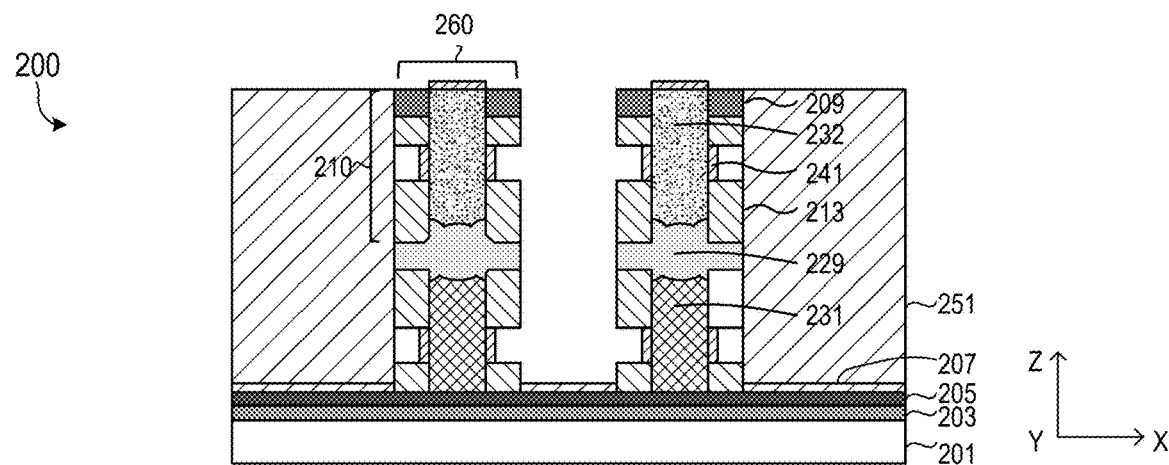
Figure 18:
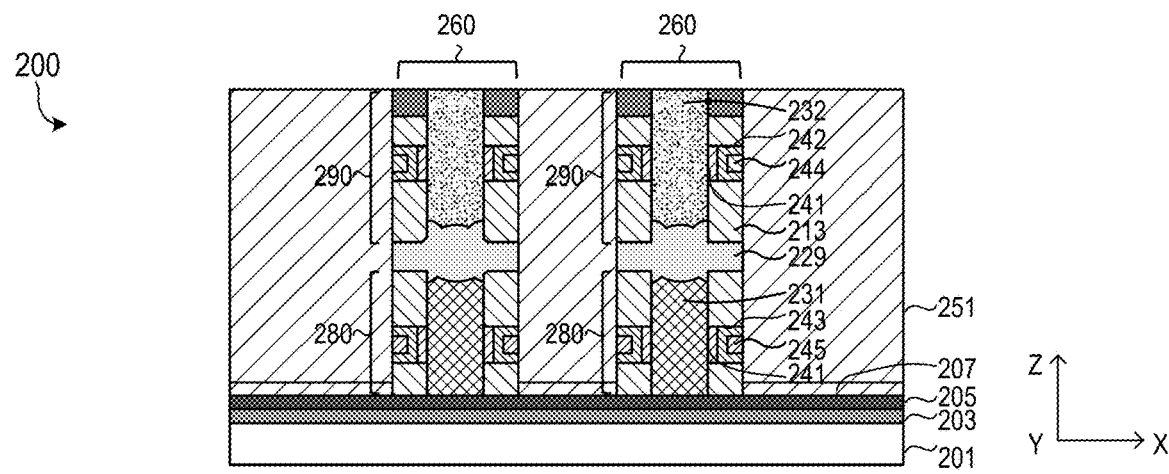

FIGS. 2-4, 9-13, and 16-18 are cross-sectional or top-down views of the semiconductor device 200 at various intermediate steps of a third manufacturing process, in accordance with exemplary embodiments of the disclosure. The third manufacturing process begins with FIGS. 2-4 and 9-13 and then proceeds to FIGS. 16-18. FIGS. 16-18 illustrate how the high-k gate dielectric 241 and the WFMs (242-245) can be formed prior to removal of the support structures 251.

Going from FIG. 13 to FIG. 16, the sacrificial gate layers 211 are removed from the separate stacks 260. As a result, portions of the first channels 231 and portions of the second channels 232 are uncovered. In FIG. 17, the high-k dielectric 241 is deposited all around the uncovered portions of the first channels 231 and the uncovered portions of the second channels 232. FIG. 18 shows the semiconductor device 200 after WFM deposition and sacrificial material deposition. FIG. 18 is similar to FIGS. 8 and 15, except that the support structures 251 remain in the finished stack. It is understood that the support structures 251 can also be replaced by the third dielectric 202.

FIGS. 2 and 19-23 are cross-sectional or top-down views of the semiconductor device 200 at various intermediate steps of a fourth manufacturing process, in accordance with exemplary embodiments of the disclosure. The fourth manufacturing process shows 3D isolation of vertical transistors that have vertical channel structures separated by sacrificial interface structures disposed at the transition layers. Some embodiments show two or more vertical CMOS GAA transistors that have a grown epitaxial doping of N+ region, followed by in-situ SiGe epitaxial growth and then in-situ P+ silicon or germanium. Invention examples show two devices separated by a self-aligned grown dielectric isolation layer. An alternative process can be selected for making a different sequence of metal gate electrodes.

Figure 19:
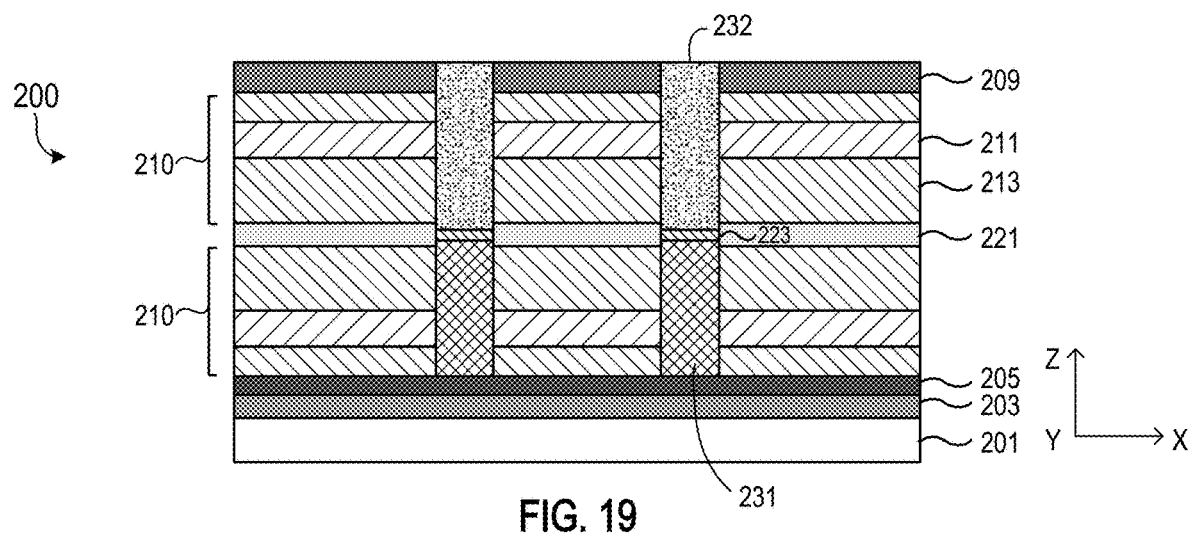

The fourth manufacturing process begins with FIG. 2 and proceeds to FIG. 19. FIG. 19 is similar to FIG. 3, except that sacrificial interface structures 223 are formed at the transition layers 221. As shown, the sacrificial interface structures 223 are sandwiched between the first channels 231 and the second channels 232. In one embodiment, N+ epitaxial regions are grown from the underlying semiconductor layer 205 until reaching the future isolation region to form the first channels 231. Then, a relatively thin layer of SiGe is epitaxially grown within this isolation region or the transition layer 221 to form the sacrificial interface structures 223. Then, P+ vertical channels are epitaxially grown in situ to form the second channels 232. Note that the order of epitaxial growth can be reversed. Also, any type of undoped or doped element for any epitaxial element can be used with embodiments herein depending on circuit and device requirements.

Figure 20A:
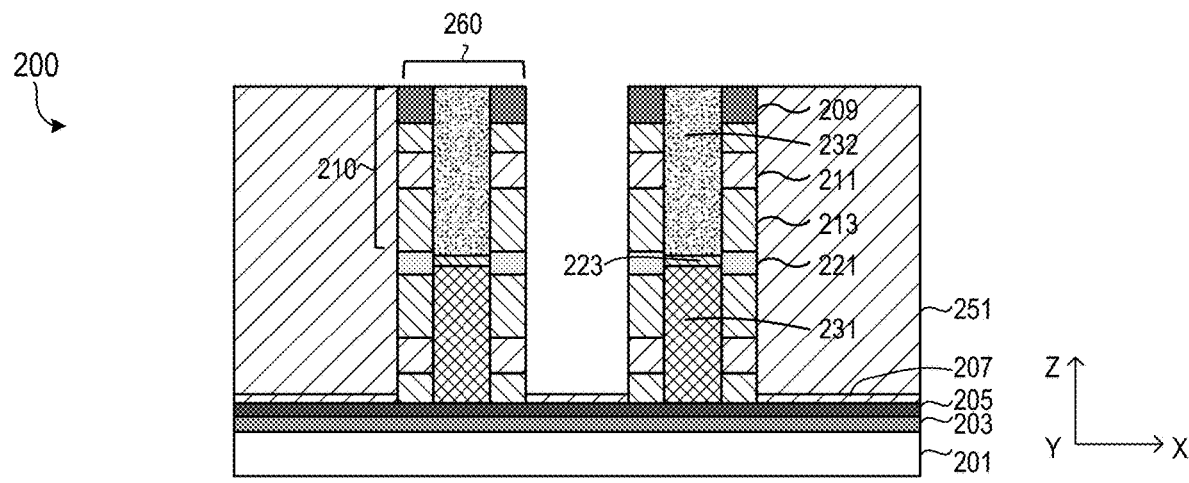
FIGS. 20A, 20B, and 20C are cross-sectional views taken along the line cuts 20A20A', 20B20B', and 20C20C' in FIG. 20, respectively, in accordance with exemplary embodiments of the disclosure.
Figure 20:
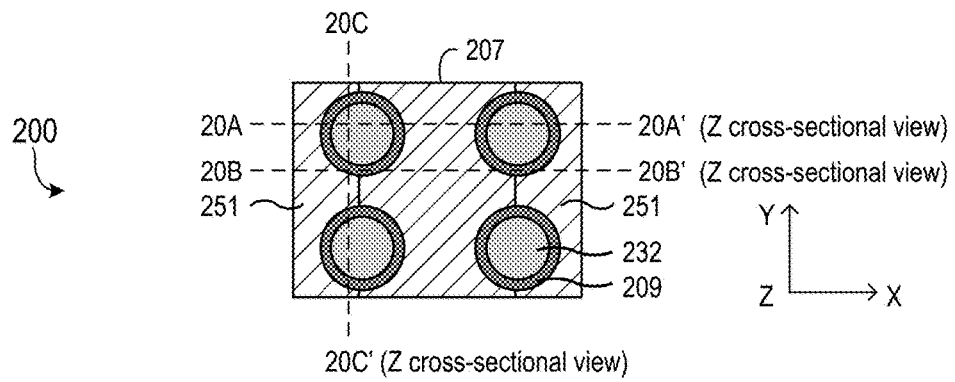
Figure 20B:
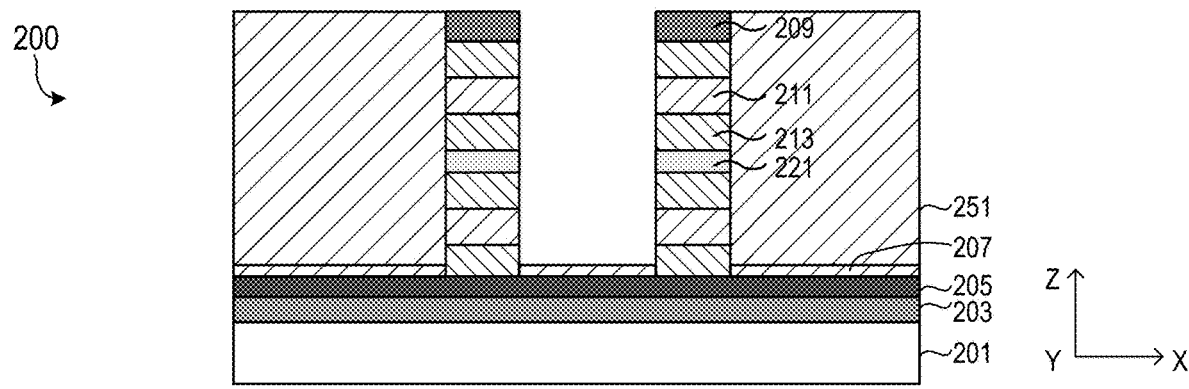
Figure 20C:
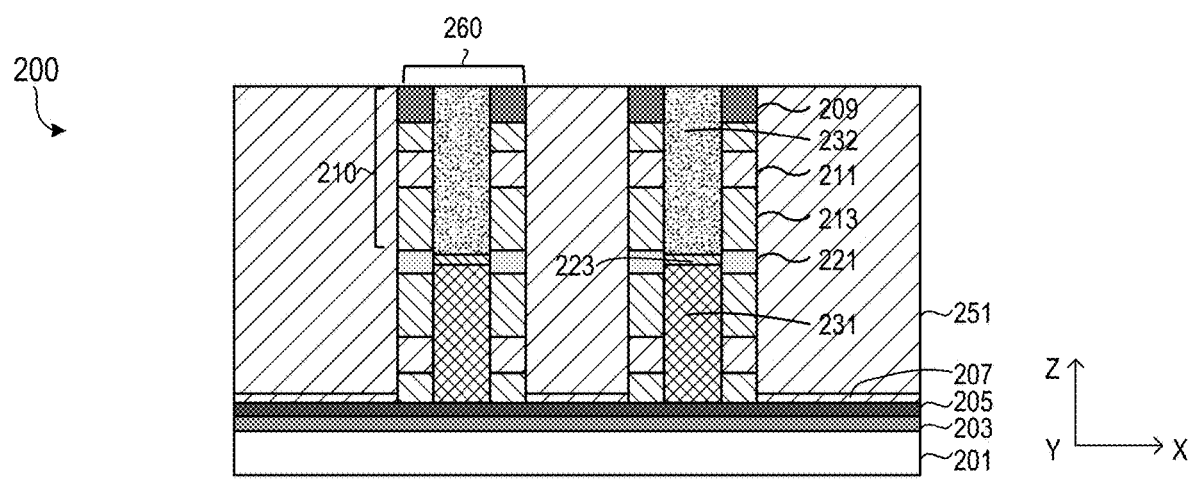

In FIG. 20A, the support structures 251 are formed. First, the initial stack is divided into the separate stacks 260, similar to FIG. 4. Then, the semiconductor device 200 follows a similar flow and process to FIGS. 9-11. FIG. 20 is a top-down view of the semiconductor device 200 in FIG. 20A where FIG. 20A is a cross-sectional view taken along the line cut 20A20A'. FIGS. 20B and 20C are cross-sectional views taken along the line cuts 20B20B' and 20C20C' in FIG. 20, respectively. As shown, the semiconductor device 200 herein is similar to what is shown in FIGS. 11 and 11A-11C, expect that the sacrificial interface structures 223 are disposed between the first channels 231 and the second channels 232.

Figure 21:
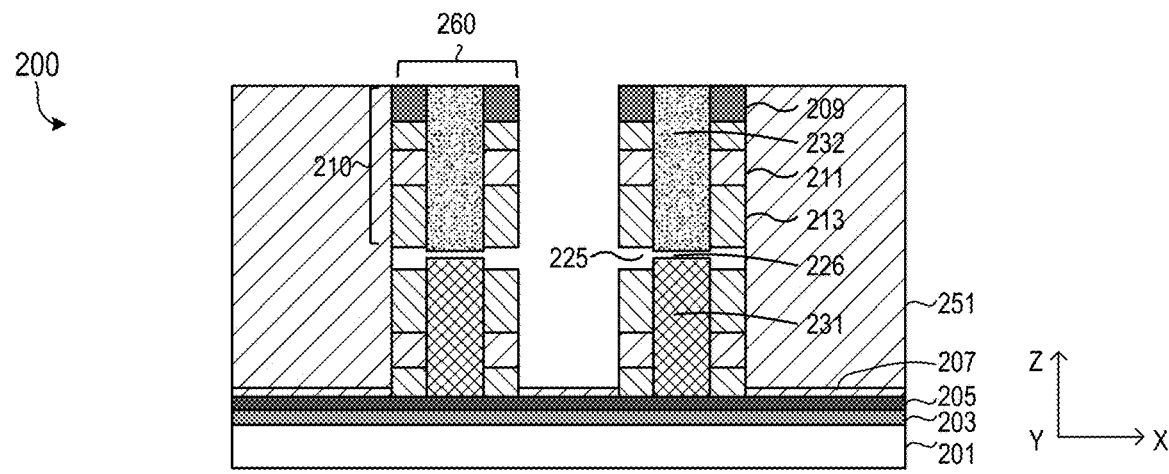

In FIG. 21, the transition layers 221 are removed, and then the sacrificial interface structures 223 (e.g., SiGe) are removed. Consequently, the transition points 225 between neighboring vertical channel structures 231 and 232 are uncovered. At this point, the vertical channel structures 231 and 232 in the separate stacks 260 are physically separated from each other. In other words, there is now a gap 226 between the NMOS channel (e.g., 231) and the PMOS channel (e.g., 232) in the separate stacks 260. As illustrated, the support structures 251 can hold the substacks 210 and prevent the separate stacks 260 from collapsing.

Figure 22:
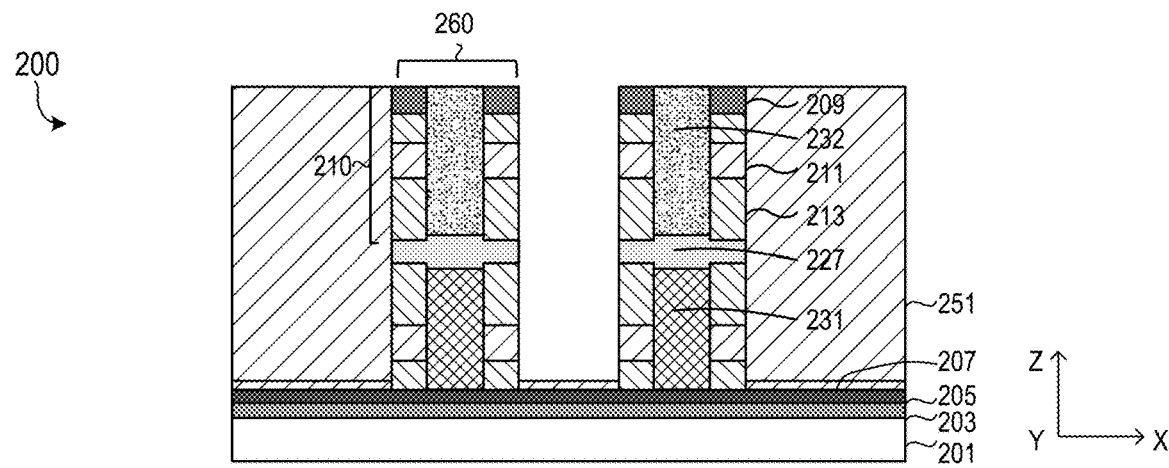

In FIG. 22, isolation structures 227 are formed at the transition points 225. Similar to the isolation structures 229 in FIGS. 6 and 13, the isolation structures 227 can be made of silicon oxide, germanium oxide, and/or another electrical insulator and formed by oxidation and/or oxide deposition. Particularly, the gap 226 can be filled with oxide or otherwise oxidized. Oxidation of the vertical channel structures 231 and 232 can convert, for example, silicon region to vertical 3D silicon oxide isolation. At this point, the two vertical channel structures 231 and 232 are isolated.

Figure 23:
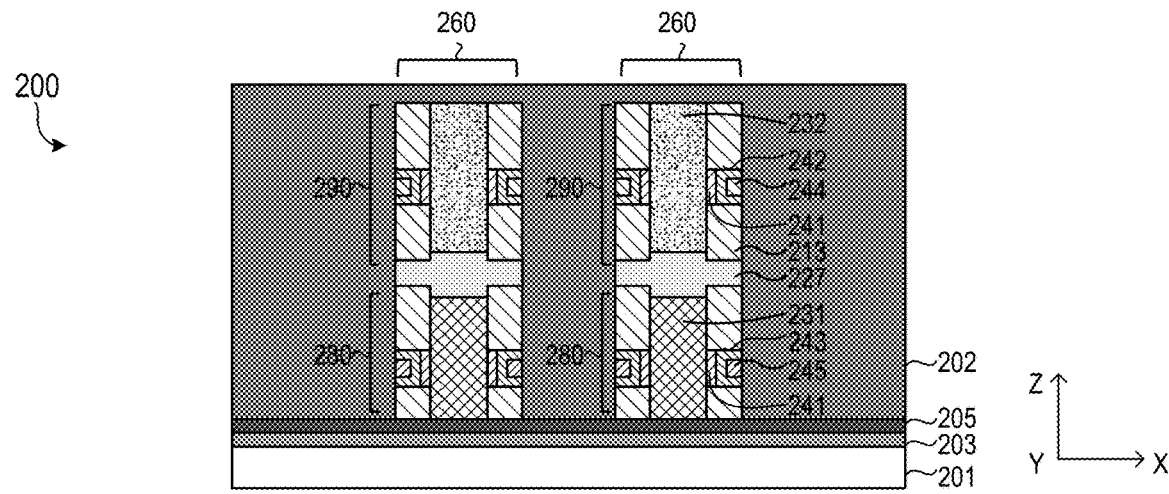

FIG. 23 shows the semiconductor device 200 after removing the support structures 251 and the sacrificial gate layers 211, depositing the high-k dielectric 241 and the WFMs 242-245, and depositing the third dielectric 202, following a similar flow to FIGS. 13-15. Alternatively, the semiconductor device 200 can follow a similar flow to FIGS. 16-18, including removal of the sacrificial gate layers 211, deposition of the high-k dielectric 241 and the WFMs 242-245, removal of the support structures 251, and deposition of the third dielectric 202. As a result, the semiconductor device 200 in FIGS. 8, 15, and 23 and the semiconductor device 100 in FIGS. 1A-1B can correspond to each other.

Note that various combinations of the above flows can be practiced. Any dielectric stack or epitaxial stack or substrate may be used with techniques herein. Also note that devices to be isolated can be in any sequence starting from any substrate condition to form vertical CMOS GAA transistors (i.e., an example for 2 transistors is NMOS-lower/PMOS-upper, NMOS-upper/PMOS-lower, NMOS/NMOS, PMOS/PMOS). 3D isolation may also be executed on a stack including a plurality of transistors because isolation is executed on all transistors at once for the 3D transistor stack. Techniques herein cover all channel materials that can be oxidized with a grown oxide (i.e. Si, Ge, SiC, SiGe or any $Si_xZ_y$, $Ge_xZ_y$ where Z can be any element that can be grown expitaxially).

The various embodiments described herein offer several advantages. For example, the isolation structures are formed simultaneously and separate the vertical transistors from each other. The support structures can hold the separate stacks during manufacturing and allow for more transistors to be stacked in the vertical direction.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
   a semiconductor layer;
   at least two layers of transistors over the semiconductor layer, each layer of transistors including a plurality of transistors that are separated from each other along a horizontal plane and aligned with respective transistors of other layers in a vertical direction; and
   isolation structures sandwiched between neighboring transistors in the vertical direction,
   wherein one or more of the transistors comprise
      a vertical channel structure, a source region and a drain region on two opposing ends of the vertical channel structure, and a gate stack around the vertical channel structure.

2. The semiconductor device of claim 1, wherein the gate stack comprises a high-k dielectric around the vertical channel structure and a work function metal around the high-k dielectric.

3. The semiconductor device of claim 1, wherein a plurality of vertical channel structures is aligned with each other in the vertical direction.

4. The semiconductor device of claim 1, wherein a plurality of vertical channel structures within a particular layer of transistors comprises a same channel material; and the plurality of vertical channel structures of the particular layer of transistors comprises a different channel material from a plurality of vertical channel structures of a neighboring layer of transistors.

5. The semiconductor device of claim 4, wherein the layers of transistors alternate between a PMOS layer and an NMOS layer.

6. The semiconductor device of claim 1, wherein the isolation structures comprise at least one of silicon oxide, germanium oxide, or another electrical insulator.

7. The semiconductor device of claim 1, wherein the vertical channel structure is configured to have a current flow in a vertical direction substantially perpendicular to the horizontal plane.

8. The semiconductor device of claim 1, wherein the vertical channel structure comprises epitaxial grown semiconductor material.

9. The semiconductor device of claim 3, wherein the plurality of vertical channel structures, which is aligned with each other in the vertical direction, has a same conductivity.

10. The semiconductor device of claim 3, wherein the plurality of vertical channel structures, which is aligned with each other in the vertical direction, has different conductivities.

11. The semiconductor device of claim 1, wherein:

the vertical channel structure has a circular cross-section along the horizontal plane, and the gate stack includes a gate-all-around (GAA) structure that completely surrounds a portion of the channel structure.

\* \* \* \* \*

UNITED STATES PATENT AND TRADEMARK OFFICE
CERTIFICATE OF CORRECTION

| | |
|---|---|
| PATENT NO. | : 11,842,919 B2 |
| APPLICATION NO. | : 17/094947 |
| DATED | : December 12, 2023 |
| INVENTOR(S) | : Gardner et al. |

It is certified that error appears in the above-identified patent and that said Letters Patent is hereby corrected as shown below:

In the Claims

In Column 13, Claim 4, Line 10, delete "wherein" and insert -- wherein: --, therefor.

Signed and Sealed this
Second Day of July, 2024

*Katherine Kelly Vidal*

Katherine Kelly Vidal
*Director of the United States Patent and Trademark Office*